United States Patent [19]

Klaas

[11] 4,301,518

[45] Nov. 17, 1981

[54] DIFFERENTIAL SENSING OF SINGLE ENDED MEMORY ARRAY

[75] Inventor: Jeffrey M. Klaas, Rosenberg, Tex.

[73] Assignee: Texas Instruments Incorporated, Dallas, Tex.

[21] Appl. No.: 90,381

[22] Filed: Nov. 1, 1979

[51] Int. Cl.³ .................. G11C 11/40; G11C 7/00
[52] U.S. Cl. .................................... 365/185; 365/207
[58] Field of Search ............... 365/205, 184, 185, 207

[56] References Cited

U.S. PATENT DOCUMENTS

| | | | |
|---|---|---|---|
| 3,851,317 | 11/1974 | Kenyon | 365/184 |
| 3,992,701 | 11/1976 | Abbas et al. | 365/184 |
| 4,090,257 | 5/1978 | Williams | 365/184 |
| 4,094,008 | 6/1978 | Lockwood et al. | 365/184 |

OTHER PUBLICATIONS

Haug et al., "Programmable Read-Only Memory", IBM Tech Disc. Bul., vol. 18, No. 2, 7/75, pp. 445-446.

Primary Examiner—Stuart N. Hecker
Attorney, Agent, or Firm—John G. Graham

[57] ABSTRACT

A single-ended array of rows and columns of memory cells of the floating gate EPROM type employs a differential sense circuit for producing a data output voltage. The sense circuit allows the array to be biased independent of the sense operation. A reference voltage is provided for direct comparison to the operating point of the selected column line, producing a differential voltage whose polarity indicates the logic state of the selected cell.

17 Claims, 4 Drawing Figures

DIFFERENTIAL SENSING OF SINGLE ENDED MEMORY ARRAY

BACKGROUND OF THE INVENTION

This invention relates to semiconductor memory devices, and more particularly to sense circuits for single-ended memory array devices.

Floating gate type electrically programmable memories are manufactured using cell arrays of the type seen in U.S. Pat. Nos. 4,112,509 and 4,122,544, issued to Wall and McElroy, assigned to Texas Instruments. Several manufacturers produce EPROM devices of these or similar layouts in 8K, 16K, 32K and recently 64K bit sizes. The continuing demand for higher speed and lower cost, however, requires reduction in cell size or increase in bit density. Other improvements in EPROM devices include the requirement for a "power down" condition, and the use of only one 5v power supply.

In prior EPROM devices, sensing of the state of the addressed bit in an array has been by means of a circuit which also functioned as the array bias source. The column decoding scheme allowed only a single column line to be biased at one time; nonselected column lines were electrically floating. This type of sense circuit has disadvantages in the power down condition because all the column lines were discharged, so on power up the array had to be precharged. The circuit also required delicate matching of current sources to the characteristics of the storage cells, and stringent control of reference voltages. The number of transistors in series in the sense circuit made the voltage swing to be detected much smaller than preferred for conservative design. The prior circuit was basically a current detection scheme. The conflicting requirements of array bias and logic detection in the prior circuit cause the device to be slow, difficult to power down, and susceptible to process parameter variations.

Single-ended memory arrays have generally employed single-ended sensing circuits. Differential sense amplifiers have been commonly used in dynamic RAM memory devices where the column lines are split into two equal halves. Examples of typical sense amplifiers of this type are shown in U.S. Pat. No. 4,081,701, issued to White, McAdams and Redwine, or application Ser. No. 944,822 filed Sept. 22, 1978, both assigned to Texas Instruments or in Electronics magazine of Sept. 13, 1973, at pp. 116–121, Feb. 19, 1976, at pp. 116–121, May 13, 1976, at pp. 81–86 and Sept. 28, 1978, at pp. 109–116.

It is the principal object of this invention to provide an improved data output circuit for memories such as EPROM or ROM devices. Another object is to provide an improved sensing circuit for "virtual ground" type memory arrays as used for MOS EPROM or ROM devices. A further object is to provide a read-out arrangement for accessing a memory array in an improved manner.

SUMMARY OF THE INVENTION

In accordance with one embodiment of the invention, an array or rows and columns of memory cells of the floating gate EPROM type employs a differential sense circuit for producing a data output voltage. The sense circuit allows the array to be biased independent of the sense operation. A reference voltage is provided for direct comparison to the operating point of the selected column line, producing a differential voltage whose polarity indicates the logic state of the selected cell.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
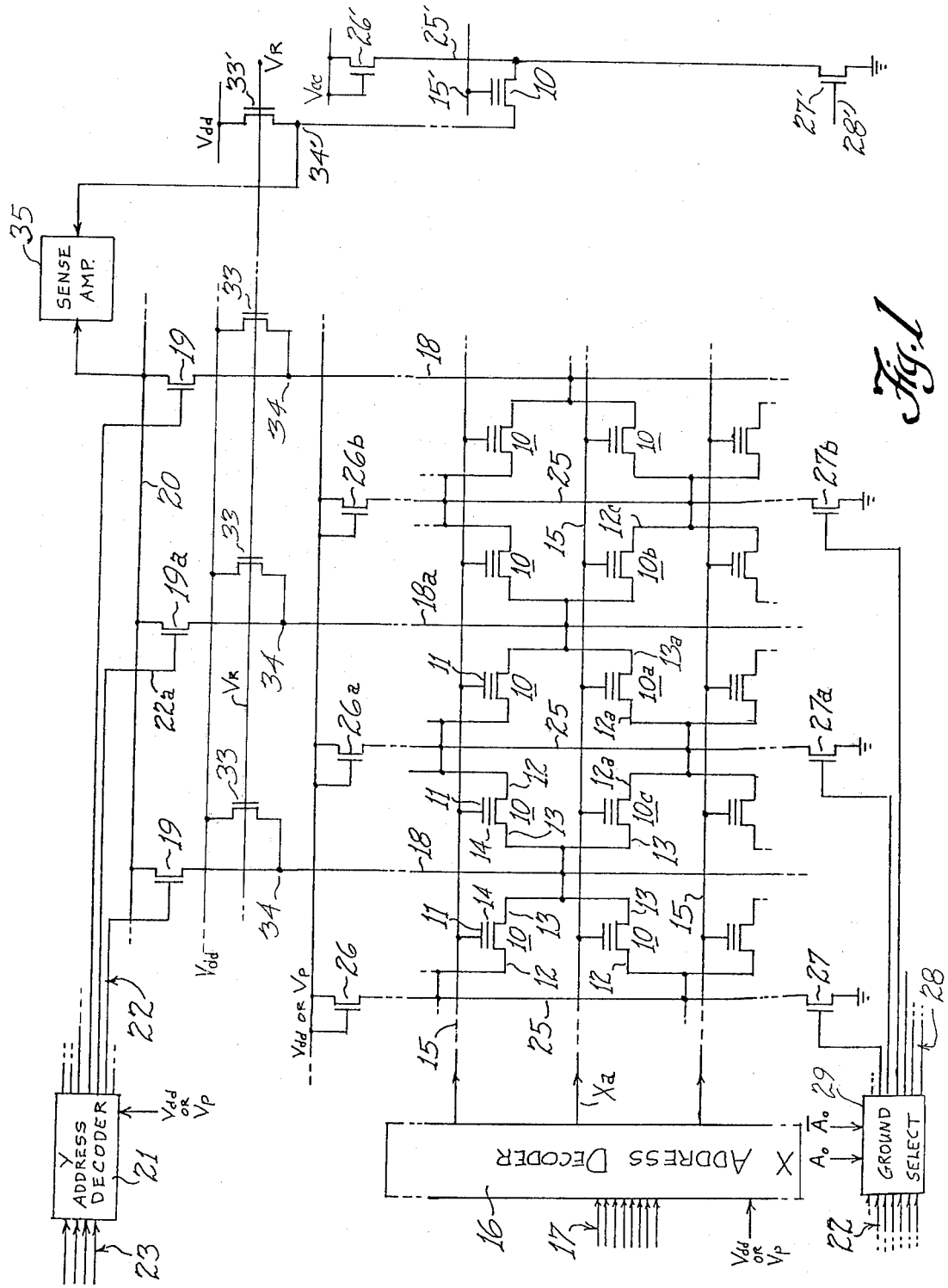
FIG. 1 is an electrical schematic diagram of a cell array and output circuit according to the invention.

Referring to FIG. 1, a memory device is shown which has an array of rows and columns of memory cells 10, each of which is an insulated gate field effect transistor having a control gate 11, a source 12 and a drain 13. The cells may be of the read-only or ROM type, or may be of the electrically programmable or EPROM type. In the latter case, each cell would have a floating gate 14 between the control gate 11 and the channel between source and drain.

The control gates 11 of all cells in each row are connected to one of a set of row lines or X lines 15. In a $256 \times 256$ array containing 65,768 cells, for example, there would be 256 of the lines 15 connected to an X decoder 16 which selects 1-of-256 based on a 8-bit X or row address on lines 17. In a read operation, the selected one of the lines 15 goes high, the others remain low.

The drains 13 of adjacent cells 10 are connected in common to Y output lines 18; in the $256 \times 256$ cell array example there are 128 lines 18 which are ordinarily partitioned to produce an 8-bit parallel output from the device so there would be eight groups of thrity-two cells per group and each group would contain sixteen of the lines 18. The lines 18 are connected through Y output select transistors 19 to a Y output line 20 (there would be eight separate lies 20, one for each group of thirty-two cells 10). The gates of the transistors 19 are connected to a Y decoder 21 via lines 22 which function to apply a logic 1 voltage to one of the lines 22 and hold the others at Vss. In this example, the decoder 21 is a one-of-16 decoder of standard construction, needing a 4-bit address input on lines 23. A 5-bit address is needed to select one-of-32 cells in a group, so only the four MSB bits $A_1$–$A_4$ of a 5-bit Y address $A_0$–$A_4$ are needed. The LSB address bit $A_o$ is only used in the ground side. The one-of-16 decoder 21 and the lines 22 are shared by all eight groups on the Y output side; these need not be duplicated for each group.

The sources 12 of adjacent cells 10 are connected in common to another set of column lines 25 which function as ground lines. In each group of 32 cells 10 seventeen lines 25 are needed. That is, for an $M \times N$ array the number of ground lines is $(N/2)+1$. Each line 25 is connected through a load device 26 to Vdd, and is also connected through a column select transistor 27 to ground or Vss. The gates of all of these transistors 27 are connected via lines 28 to a selector 29 which receives the output lines 22 from the Y decoder 21, along with the LSB address bit $A_o$ and its complement $\overline{A_o}$, and functions to activate only one of the lines 28 for a given Y address; alternatively, separate decoders can be used.

Figure 2:
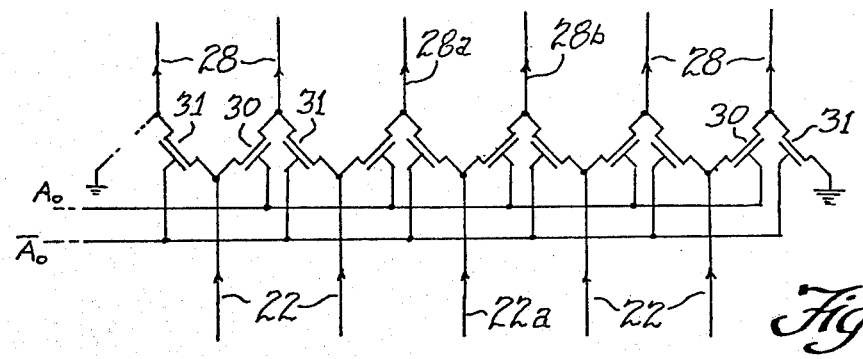
FIG. 2 is an electrical schematic diagram of part of the decode circuit used in the memory device of FIG. 1.

A schematic diagram of the select circuit 29 is seen in FIG. 2, where the Y decode outputs 22 are shown to generate the one-of-17 selection on the lines 28 by using transistors 30 having gates connected to $A_o$ and transistors 31 having gates connected to $\overline{A_o}$. For example, if line 22a is high, then line 28a will go high if $\overline{A_o}$ is 1 or line 28b will go high if $A_o$ is 1, turning on either transistor 27a or 27b, respectively. This results in selection of cell 10a or 10b, either of which connects to output via line 18a through transistor 19a (turned on by line 22a).

The decode circuitry and the cell matrix must meet certain requirements for proper operation. Programming of a cell requires a voltage Vp of +15 to +25 on the drain 13 and a source-to-drain current of from 0.5 to 3.0 ma. Reading the EPROM matrix cell requires detecting of currents in the 15 of 60 microamp range.

In the preceding example, for a read operation, Xa (one of the row address lines 15) is high, at +5 V, and transistors 19a and 27a are on. All of the other transistors are off. The transistor 27a must be large enough to pull down the load device 26a, conduct to ground any current through transistors 10a and 10c and maintain a very low level approximately 0.2 to 0.3 volts on the node 12a. The load 26b is needed to charge up the node 12c to a point that the cell 10b is turned off. This eliminates the need for the sense amplifier connected to the output line 20 to charge the capacitance of the node 12c and beyond. The cell 10b will turn off with a low voltage on the node 12c due to the large body effect of the transistors 10. The body effect is large due to the P+ tank used in making these transistors, or the P region in the channel.

To write into or program the cell 10a, the same transistors are turned on or off as for a read operation, but this time the on transistors have a large positive voltage Vp on their gates. The transistor 27a must be large enough to hold the node 12a at approximately 0.3 volts and have 1 to 3 ma passing through. The transistor 19a will have a large voltage +Vp on its drain causing a large voltage on the node 13a. The load 26b again charges the node 12c, this time so that the cell 10c does not program. A voltage of +3 v or more on the node 12c will prohibit the cell 10c from programming.

According to the invention, each of the column lines 18 is connected by a load transistor 33 to Vdd; the gates of these load transistors have a reference voltage Vr thereon. The column lines 18 thus act as the output nodes 34 of inverter circuits, and the selected one of such nodes 34 will assume a voltage level dependent on the ratio of the load transistor 33 vs. the selected storage cell 10. For a prgrammed cell the transistor 10 will not conduct, leaving the line 18 (node 34) at its maximum voltage, while an erased cell 10 will pull the line 18 to its minimum. A point half way between these two extremes will be the reference point for a differential sense amplifier 35. One input for the sense amplifier 35 is from the nodes 34 via Y select transistors 19 and line 20. The other input is from a reference voltage generator circuit.

The reference voltage Vref is from a circuit which includes an EPROM transistor 10' made like the transistor 10 and a load transistor 33' which is like the load transistors 33 (but with a channel width twice as wide to produce the half way point). A load transistor 26' and a grounding transistor 27' simulate the load 26 and ground device 27 for a "virtual ground" column line 25. A voltage on line 28' to the gate of the transistor 27' is about (Vdd−Vt), the same as a select voltage on one of the lines 28, so the line 25 in the reference generator will exhibit exactly the same voltage, impedence, etc. as a selected line 25 in the array. The gate of the transistor 10' has a voltage in its gate from line 15' which is also about (Vdd−Vt), or the same as that on a selected X line 15. Thus, on one side of a node 34' the operation will be identical to that of a cell in the array and will track all variations due to supply voltage changes, temperature, aging, process variations in threshold voltage, etc. On the load side, the node 34' is connected to Vdd through a load transistor 33' corresponding to one of the load transistors 33 for the column lines 18 of the array. The transistor 33' has the same reference voltage Vr on its gate as the transistors 33. This reference voltage Vr is perhaps about 4 volts for a device having Vdd=+5 v. Vr is selected to optimize the voltage change on the node 34; the voltage drop should be enough to be sensed but not a full logic level.

Figure 3:
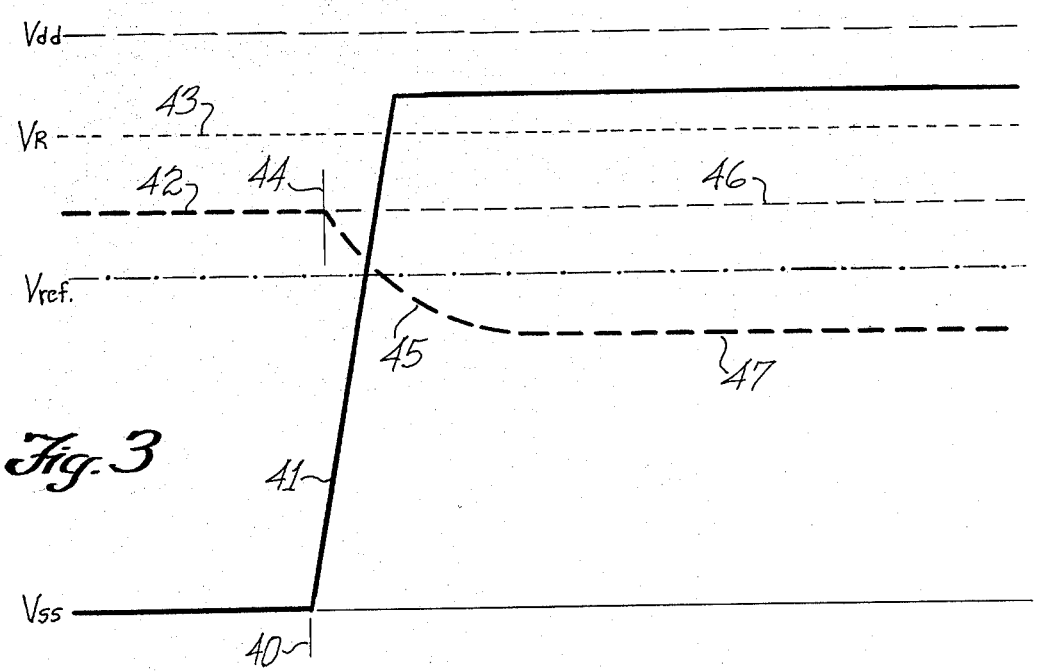
FIG. 3 is a graphic representation of voltage vs. time for voltages appearing a various points in the circuit of FIG. 1.

In a preferred embodiment the load transistor 33' has a channel twice as wide as that of a transistor 33 so its impedence is half as great. Another way of accomplishing the same effect is to place two of the transistors 10' is series instead of one and load transistor 33' equal to 33. Either produces Vref voltage at node 34' which is half that of the node 34 voltage change between program and erase condition for a selected transistor 10. Referring to FIG. 3, at a time 40 selected X line 15 goes high as seen by a line 41. Depending upon circuit design, the X select voltage may be a full Vdd swing, from Vss to Vdd, or may be less than that, going from Vss to (Vdd−Vt). The voltage on the node 34 as shown by a line 42 stays at a level determined by the Vr voltage shown by the line 43 if the selected cell is programmed (floating gate charged) because the transistor 10 will not turn on. On the other hand, if the selected transistor 10 is erased, the node 34 begins to discharge at a time 44 when the threshold voltage of the transistor 10 is exceeded by the voltage 41 on the line 15. As the voltage 41 continues to increase, the current through the transistor 10 increases and the voltage on the node 34 decreases as seen by the curve 45 until it flattens out at a level dependent upon the Vr level. If Vr is low, the noder 34 would go all the way to ground, which would be more than necessary and detrimental because the column line would then have to be charged all the way back up. If Vr is too high, the level 42 is too high, near Vdd. Vref is seen to be a level which is half way between the voltage level 46 (for a programmed transistor 10) and level 47 (the final level of the node 34 for an erased transistor 10).

Figure 4:
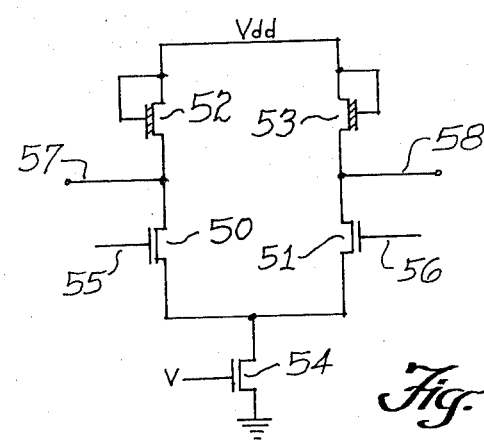
FIG. 4 is an electrical schematic diagram of a differential amplifier used in the sense amplifier of FIG. 1.

The sense amplifier 35 may be any one of many differential type amplifiers which are known to those skilled in the art. For example, a differential amplifier circuit is shown in FIG. 4 which may be used as the sense amplifier 35. This circuit consists of a balanced pair of driver transistors 50 and 51 along with depletion load transistors 52 and 53. A transistor 54 connects both of the driver transistors to ground, and the transistor 54 has a bias on its gate to cause it to operate as a current source. One input 55 is connected to the output line 20, and the other input 56 is connected to the node 34', i.e., the Vref voltage. The outputs 57 and 58 will tend to go toward Vdd or Vss depending upon the polarity of the difference between the voltages on the inputs 55 and 56. Usually several stages of the circuit of FIG. 4 would be cascaded to form a high gain sense amplifier; that is, the outputs 57 and 58 connected to the inputs 55 and 56 of the next stage, and so on. The final output would be one of the lines 57 or 58 of the last stage, which would exhibit a full logic level swing. This would be the output which is coupled to the external system via output buffer.

It is important to note that the differential sense amplifier is sensing voltage, not current. The voltage on the nodes 34 or 34' need only charge the gates of the input transistors 50 and 51; there is no significant current loading, except this transient. Thus, no voltage drop occurs across the Y select transistors 19, or other decode transistors of a different selection scheme is used.

All of the lines 18 are charged through the loads 33, and all ground lines 18 are charged through the loads 26. Only the selected column lines are discharged during a read cycle, and these not always to ground. In the power down condition, all of the X select lines 15 are grounded and all of the ground select llines 28 are grounded, so there is no discharge of the column lines, yet no d.c. power dissipation. All column lines are held at their bias point 42, so upon power up there is no delay while precharging the array. The access time upon coming out of power down should be the same as in normal operation.

In one embodiment, the Vref voltage is not exactly halfway between the 1 and o levels 46 and 47 of FIG. 3. Instead the load 33' is modified in size to produce a Vref slightly below halfway to equalize switching times. This is appropriate due to the nonlinear nature of the load devices 33.

Although described with reference to an EPROM memory device, the output circuitry of the invention could be usd just as well from a ROM of similar design. That is, the device would be the same except no floating gates 14 and no programming voltage Vp. Also, the concept of the invention could be used in a static RAM of the type which employs the classic six-transistor cell, if single output column lines were used instead of double.

The load resistors 33 and 33' may be replaced by matched sets of dual transistors having different Vr voltages applied, which would give greater control to the shape of the curve 45 of FIG. 3 andits final level 47. This embodiment has advantages in adjusting the circuit for optimum performance in exiting from a power down condition.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplted that the appended claims will cover any such modifications or embodiments as fall within the true scope of the invention.

What is claimed:

1. A memory device comprising an array of rows and columns of memory cells, means for selectively coupling each column to one input of a differential sense amplifier, means connecting each column to reference potential voltage via a selected one of said memory cells, means separately connecting each column to a supply voltage via a first load device, a referenece node connected to the other input of said differential sense amplifier, means connecting said reference node to said supply via a second load device corresponding to one of said first load devices, means connecting said reference node to reference potential via a dummy memory cell constructed the same as memory cells of said array.

2. A memory device according to claim 1 wherein the memory cells are floating gate electrically programmable ROM cells.

3. A memory device comprising an array of rows and columns of memory cells, means for selectively coupling each column to one input of a differential sense amplifier, means connecting each column to reference potential via a selected one of said memory cells, means separately connecting each column to a supply voltage via a first load device, a reference node connected to the other input of said differential sense amplifier, means connecting said reference node to said supply voltage via a second load device corresponding to one of said first load devices, means connecting said reference node to reference potential via a dummy memory cell corresponding to memory cells of said array, said first and second load devices being transistors having a bias voltage applied to the gate thereof.

4. A memory device according to claim 3 wherein said bias voltage is less than said supply voltage but much greater than a threshold voltage.

5. A memory device according to claim 4 wherein said second load device has an impedence of half that of said first load devices.

6. A memory device according to claim 5 wherein said dummy memory cell is of exactly the same structure as one of said memory cells.

7. A memory device according to claim 3 wherein the memory cells are floating gate electrically programmable ROM cells.

8. A semiconductor memory device comprising an array of rows and columns of memory cells in a face of a semiconductor body, each cell including a transistor having a control electrode and a current path between first and second electrodes, a plurality of row lines, the control electrodes of all transistors in a row being electrically connected to a row line, a plurality of column lines, alternate first and second column lines adjacent one another functioning as ground lines and output lines, respectively, all of the first electrodes of adjacent transistors in adjacent columns of cells being connected to a first column line functioning as a ground line, all of the second electrodes of adjacent transistors in adjacent columns of cells being connected to a second column line functioning as an output line, row decode means for selecting one row line for accessing the array by applying a row select voltage to said one row line, and column decode means for accessing the array by selecting a first column line and connecting it to ground by a grounding transistor and selecting second column line and connecting it to an output by a select transistor, and a plurality of load devices separately connecting each of the second column lines to a voltage supply.

9. A device according to claim 8 wherein th column decode menas receives an address input and selects only one of said first column lines and only one of said second column lines for a given address input.

10. A device according to claim 8 wherein said transistors are insulated gate field effect transistors, the first electrodes are source regions and the second electrodes are drain regions.

11. A device according to claim 10 wherein said transistors are floating gate type electrically programmable read only memory devices each having a floating gate beneath the control electrode.

12. A device according to claim 8 wherein a differential sense amplifier is included and has one input connected to said output and the other input connected to a reference voltage generator.

13. A semiconductor memory device comprising an array of rows and columns of memory cells in a face of a semiconductor body, each cell including a transistor having a control electrode and a current path between first and second electrodes, a plurality of row lines, the control electrodes of all transistors in a row being electrically connected to a row line, a plurality of column lines, alternate first and second column lines adjacent one another functioning as ground lines and output lines, respectively, all of the first electrodes of adjacent transistors in adjacent columns of cells being connected to a first column line functioning as a ground line, all of the second electrodes of adjacent transistors in adjacent columns of cells being connected to a second column line functioning as an output line, row decode means for selecting one row line for accessing the array by applying a row select voltage to said one row line, and column decode means for accessing the array by selecting a first column line and connecting it to ground by a grounding transistor and selecting second column line and connecting it to an output by a select transistor, a plurality of load devices separately connecting each of the second column lines to a voltage supply, a differential sense amplifier having one input connected to said output and the other input connected to a reference voltage generator, the reference voltage generator including a reference transistor corresponding to said memory cell and connected in series with a transistor corresponding to said grounding transistor, said other input being connected to said voltge supply by a load device corresponding to said load devices on said second column lines.

14. A device according to claim 13 wherein matched load devices separately connect each of said first column lines and said reference transistor to a supply voltage.

15. A device according to claim 13 wherein said load devices are transistors having a bias voltage on the gates thereof, said bias voltage being less than said supply voltage but much greater than a threshold voltage.

16. A device according to claim 13 wherein said transistors are insulated gate field effect transistors, the first electrodes are source regions and the second electrodes are drain regions.

17. A device according to claim 16 wherein said transistors are floating gate type electrically programmable read only memory devices each having a floating gate beneath the control electrode.

* * * * *